United States Patent
Hickling

(10) Patent No.: US 7,236,112 B2
(45) Date of Patent: Jun. 26, 2007

(54) SELF-TUNING OUTPUT DIGITAL FILTER FOR DIRECT CONVERSION DELTA-SIGMA TRANSMITTER

(75) Inventor: Ronald M. Hickling, Newburry Park, CA (US)

(73) Assignee: TechnoConcepts, Inc., Van Nuys, CA (US)

( * ) Notice: Subject to any disclaimer, the term of this patent is extended or adjusted under 35 U.S.C. 154(b) by 0 days.

(21) Appl. No.: 11/337,189

(22) Filed: Jan. 20, 2006

(65) Prior Publication Data

US 2006/0164273 A1 Jul. 27, 2006

Related U.S. Application Data

(60) Provisional application No. 60/646,059, filed on Jan. 21, 2005.

(51) Int. Cl.
*H03M 3/00* (2006.01)

(52) U.S. Cl. ............. 341/143; 341/152; 375/219; 375/242; 375/247; 375/295; 375/298; 455/91

(58) Field of Classification Search ........... 341/143
See application file for complete search history.

(56) References Cited

U.S. PATENT DOCUMENTS

| | | | |
|---|---|---|---|
| 5,323,157 A * | 6/1994 | Ledzius et al. | 341/143 |
| 5,534,827 A | 7/1996 | Yamaji | |
| 6,094,458 A * | 7/2000 | Hellberg | 375/242 |
| 6,339,621 B1 * | 1/2002 | Cojocaru et al. | 375/247 |
| 6,611,570 B1 * | 8/2003 | Subramanian | 375/326 |
| 6,990,155 B2 * | 1/2006 | Adachi et al. | 375/298 |

(Continued)

FOREIGN PATENT DOCUMENTS

EP 0 426 560 A1 8/1991

(Continued)

OTHER PUBLICATIONS

David Barkin et al., "A CMOS Oversampling Bandpas Cascaded D/A Converter With Digital FIR and Current-Mode Semi-Digital Filtering", IEEE Journal of Solid State Circuits, vol. 39, No. 4, Apr. 2004, pp. 585-593.

(Continued)

*Primary Examiner*—Khai M. Nguyen
(74) *Attorney, Agent, or Firm*—Intellectual Property Law Office of Joel D. Voelzke

(57) ABSTRACT

A self-tuning filter that is well suited for use as a output digital filter in a direct conversion delta-sigma transmitter is constructed as a high pass finite impulse response filter having a cutoff frequency of twice the desired carrier frequency. The filter is clocked using the same clock as used for the commutatation within the transmitter. The aliasing effect of the digital filter produces a passband centered around the carrier frequency which allows the information contained in the spectrum around the passband to be transmitted, while effectively filtering out the quantization noise produced by the commutation. When the commutator clock frequency is changed in order to change the carrier frequency, the passband automatically moves to track the new carrier frequency. The output filter may be constructed using series connected flip-flops with analog taps and an analog summer connected to respective Q and $\overline{Q}$ outputs, thereby producing an analog output.

19 Claims, 7 Drawing Sheets

U.S. PATENT DOCUMENTS

| | | | |
|---|---|---|---|
| 7,061,989 B2* | 6/2006 | Bellaouar et al. | 375/295 |
| 2001/0050962 A1 | 12/2001 | Adachi et al. | |
| 2004/0233085 A1* | 11/2004 | Fukuda | 341/143 |

FOREIGN PATENT DOCUMENTS

| | | |
|---|---|---|
| EP | 1 161 044 A2 | 5/2001 |

OTHER PUBLICATIONS

International Search Report and Written Opinion of the International Searching Authority in (corresponding to U.S. 10/998,212) International Application PCT/US05/00751, dated Jan. 5, 2007.

Communication Pursuant to Article 96(2) EPC (Office Action) (corresponding to U.S. 10/998,212) European Patent Application No. 05255261.9 dated Jan. 8, 2007.

* cited by examiner

FIG. 1
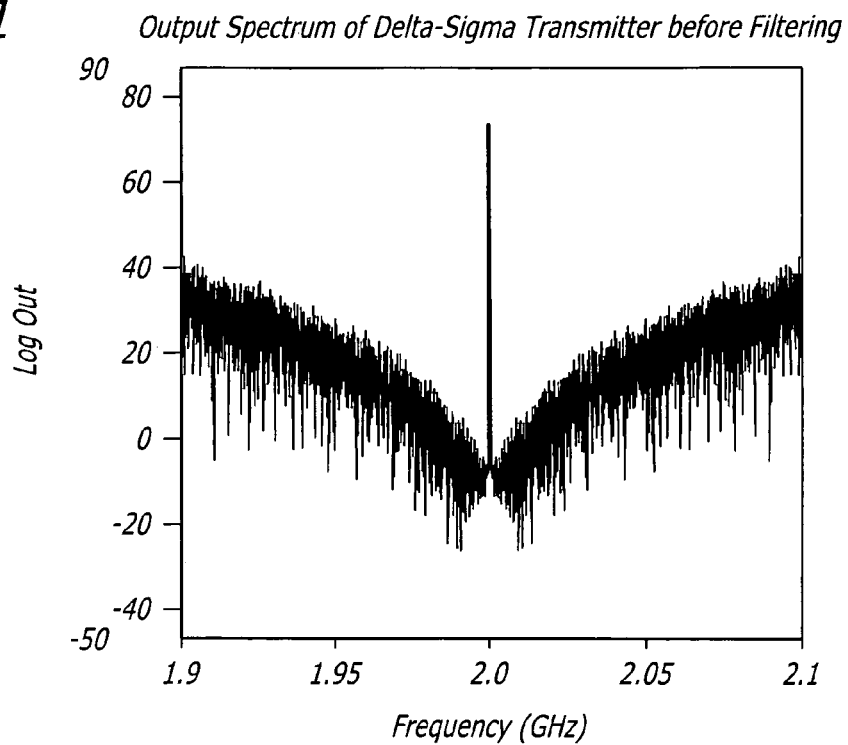
Output Spectrum of Delta-Sigma Transmitter before Filtering
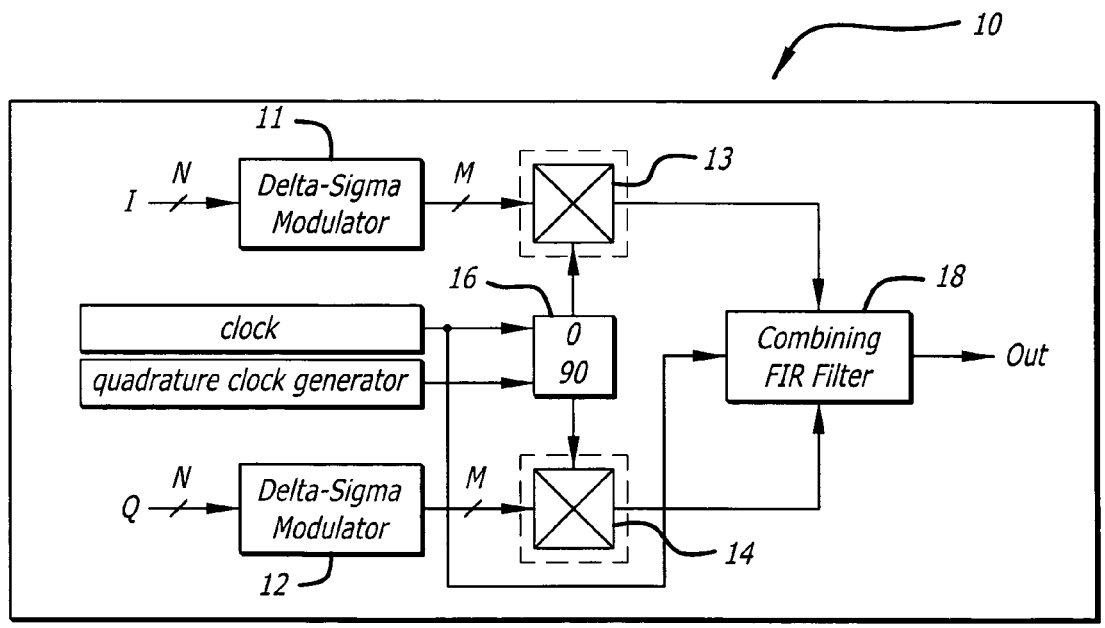
FIG. 2A FIG. 8
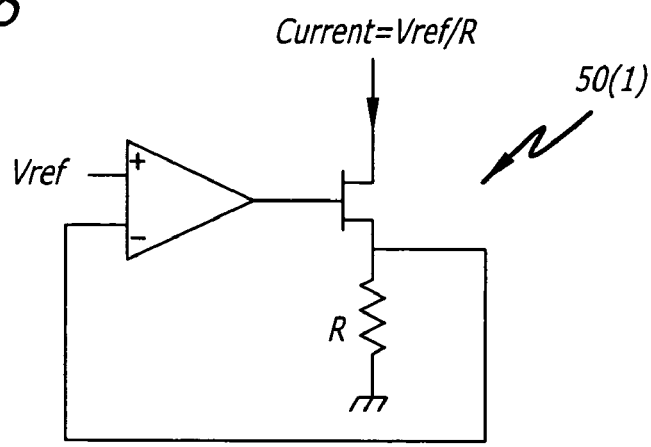
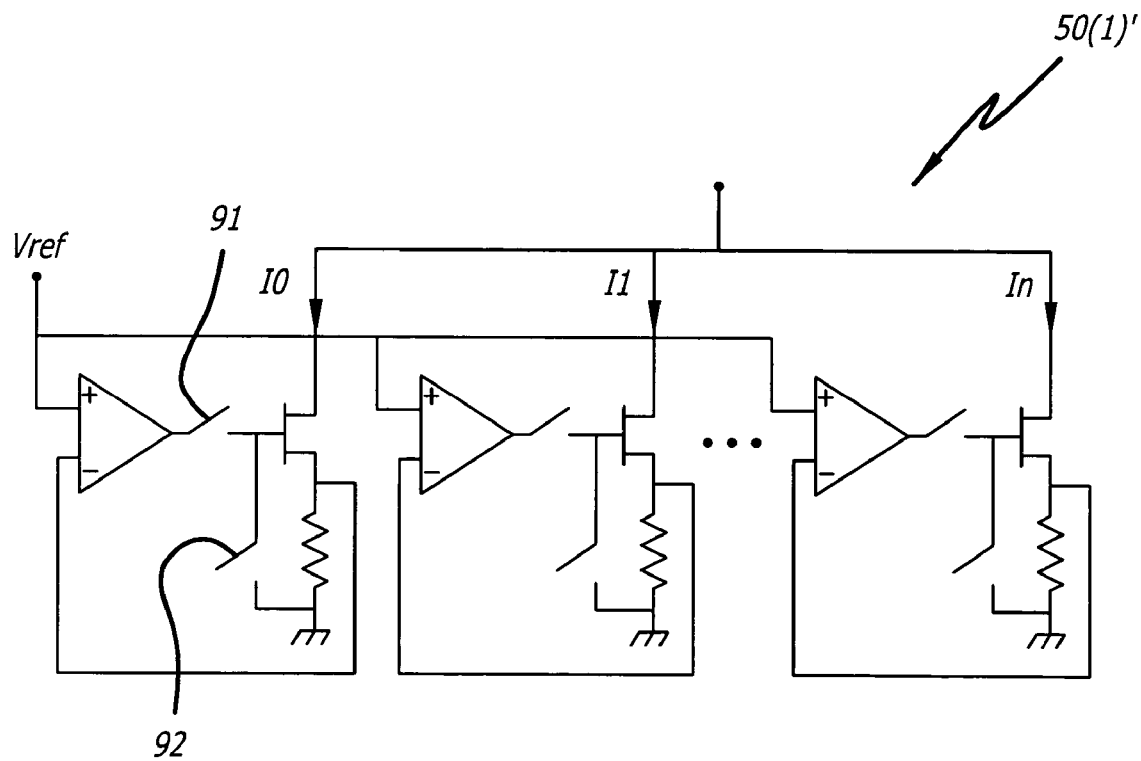
FIG. 9

SELF-TUNING OUTPUT DIGITAL FILTER FOR DIRECT CONVERSION DELTA-SIGMA TRANSMITTER

CROSS-REFERENCE TO RELATED APPLICATIONS

This application claims priority from Provisional Patent Application No. 60/646,059 filed Jan. 21, 2005.

BACKGROUND OF THE INVENTION

1. Field of the Invention

This invention relates to the field of radio frequency transmission. More particularly, this invention relates to the field of a self-tuning digital output filter for use in a delta-sigma radio frequency transmitter.

2. Description of Related Art

A continuing challenge in the transmission of wireless signals is the process of modulating a carrier signal, i.e., varying the amplitude and/or phase (frequency) in such a way as to convey information onto that carrier, in a mathematically ideal way without producing noise or distortion. Traditional systems have used either analog circuitry exclusively, or have used digital circuitry to generate a baseband or intermediate frequency (IF) waveform followed by conventional analog circuitry to translate the signal up to the required carrier frequency. In either case, the use of conventional analog circuitry has resulted in the generation of spurious signals due to the inability of analog circuitry to accomplish mathematically ideal operations.

U.S. Pat. No. 6,748,025, assigned to the assignee of the present invention, discloses the use of commutation in combination with delta-sigma conversion in the architecture of an A/D converter based linear receiver.

U.S. patent application Ser. No. 10/998,212, published as publication number US 2005/TBD and entitled Direction Conversion Delta-Sigma Transmitter, describes a transmitter that replaces analog superheterodyning with commutation as the basis for upconverting a baseband information signal to a radio frequency signal. The transmitter structure disclosed in that application uses a delta-sigma modulator followed by a commutator to upconvert the signal directly from baseband to the desired carrier frequency, followed by a discrete time analog filter to suppress the delta-sigma quantization noise outside of the band $\omega_{carrier} \pm \omega_{baseband}$ that is introduced by the commutation. FIG. 1 is a representative plot of the spectral content of the output of the delta-sigma transmitter transmitting at a carrier frequency of 2 GHz, before filtering by the digital filter. As described in the above-referenced patent application, after filtering, the output spectrum of the transmitter is a spectrum that is "clean" (having a low noise floor) in the neighborhood of the carrier frequency with the quantization noise floor rising with increasing frequency above the carrier frequency and with decreasing frequency below the carrier frequency.

An important advantage of using a delta-sigma transmitter is that the carrier frequency can be changed over a wide range merely by changing the clock frequency, which can be accomplished using software in combination with simple hardware. FIG. 1 shows the result of commutating a baseband signal with a $(-1)^n$ waveform at a clock rate of 4 GHz, for illustration's sake. The spectrum is now centered around 2 GHz with a low noise floor in the neighborhood of the carrier frequency. Although obscured by the resolution of the plot, there are two separate sidebands, which is the expected result of double sideband suppressed-carrier modulation.

As with all delta-sigma converter outputs, a separate filter is required to suppress the quantization noise floor so that only the intended output waveform remains. More precisely, depending on the exact application and the specifications for it, a separate filter is required to substantially suppress the quantization noise to a level that is acceptably low for that application. For the transmitter, a bandpass filter centered at the carrier frequency is preferred. This filter does not need to be highly selective since the rate at which the noise floor rises is very gradual for high clock rate converters. However, this bandpass filter must be tunable since a software radio is required to be-frequency agile. While practical methods for electronic tuning, such as varactors in conjunction with switched values of inductors, may be used to implement a frequency agile bandpass filter, it would be far more useful to implement a bandpass filter that is both highly selective and has a tunable center frequency.

SUMMARY OF THE INVENTION

The present invention provides an apparatus and method for providing a self-tuning digital output filter that automatically tunes itself as the carrier frequency of the delta-sigma transmitter is changed. A clocked bandpass filter approach meets the twin objectives of being highly frequency selective and being easily tunable.

In one aspect, the present invention is of a self-tuning digital filter that is particularly well suited for use as the output digital filter in a delta-sigma transmitter. The digital filter has the advantage that it is clocked using the same clock as used to clock the commutator. When the carrier frequency of the transmitter is changed by changing the commutation frequency, the passband of the digital filter automatically changes to track the new carrier frequency. The present invention therefore provides an easily tunable bandpass filter for use as the output filter within a delta-sigma transmitter.

The present disclosure describes a bandpass filter that is automatically tuned as the clock rate (and therefore output carrier frequency) of the delta-sigma transmitter is varied. This filter is designed as a digital high-pass finite impulse response (FIR) filter with a clock frequency that is twice the rate of the desired carrier frequency. The filter can be configured a real filter that is applied to the combination of the I and Q outputs, such as shown in FIG. 2A, or as a complex filter that operates on the I and Q outputs as complex numbers and produces a real or complex output, such as shown in FIG. 2B. Both filter approaches exploit the same clock used to produce the commutator outputs and therefore have passband center frequencies that track the carrier frequency directly. As with all discrete time filters, the passband width also scales with the clock frequency. This is not expected to present a significant problem because within the bandwidth of most radio frequency services, the change in passband width between the minimum carrier frequency and the maximum carrier frequency should be minimal. In any event, the coefficients of the FIR filter may be programmed, if necessary, to achieve the desired passband characteristic.

In another aspect, the invention is of a filter circuit that has a digital input and an analog output, constructed of a chain of series connected digital storage elements, and a plurality of differently weighted tap elements connected to the outputs of the storage elements, with each of the tap elements producing a respective analog output, and a summer that sums the respective analog outputs. The tap values may be defined by resistive elements, current source elements, or other elements. The tap values may be hardwired or may be variable under software control.

In one embodiment the digital filter is a high pass filter with a cutoff frequency approximately twice the carrier frequency. Such a filter also has a bandpass region centered around the carrier frequency that is the result of sample aliasing. In most applications of digital filters this bandpass region caused by aliasing is unintended and unwanted, and usually requires an analog anti-aliasing filter to be applied prior to the waveform of interest being digitized. In contrast, the present invention exploits this aliasing by using it as a bandpass filter centered about the carrier frequency.

In one embodiment the output digital filter is a single bit filter whose delay elements constitute series connected flip-flops, with the tap coefficients being implemented via resistive summing of the flip-flop Q and $\bar{Q}$ outputs with the different resistances corresponding to the different tap coefficients. In another embodiment, instead of resistive summing the output tap coefficients are implemented by differently valued current sources connected to the different Q and $\bar{Q}$ outputs. This embodiment has the advantage that the tap coefficients can be easily reprogrammed by changing the current source values.

Exemplary embodiments of the invention will be further described below with reference to the drawings, in which like numbers refer to like parts.

BRIEF DESCRIPTION OF THE DRAWINGS

FIG. 1 is a spectral plot showing the results of commutating a baseband signal with a $(-1)^n$ waveform at a clock rate of 4 GHz.

FIG. 2A is a block diagram showing the present invention implemented using a "real" FIR filter wherein the I and Q outputs from the commutator are combined and filtered.

FIG. 8 shows a first and fixed method of setting the current within a current source, for use within the current source elements of FIG. 7.

FIG. 9 shows a second and programmable method of setting the current within a current source, for use within the current source elements of FIG. 7.

DETAILED DESCRIPTION OF THE PREFERRED EMBODIMENTS

The following detailed description describes the invention with reference to an illustrative embodiment in which the carrier frequency is 2 GHz. The frequency of 2 GHz has been chosen only for discussion purposes; the carrier frequency can be any frequency suitable for RF transmission. Still further, if the invention is to be employed for modulating a waveform for transmission other than electromagnetic propagation through the medium of air, such as transmission of extremely low frequency (ELF) signals through a solid medium, then the carrier frequency could be any suitable frequency for the transmission medium and method to be employed.

FIG. 1 shows the result of commutating a typical baseband signal with a $(-1)^n$ waveform at a clock rate of 4 GHz. The output spectrum is now centered around 2 GHz with a low noise floor in the neighborhood of the carrier frequency. Although obscured by the resolution of the plot, there are two separate sidebands, which is the expected result of double sideband suppressed-carrier modulation.

Figure 2B:
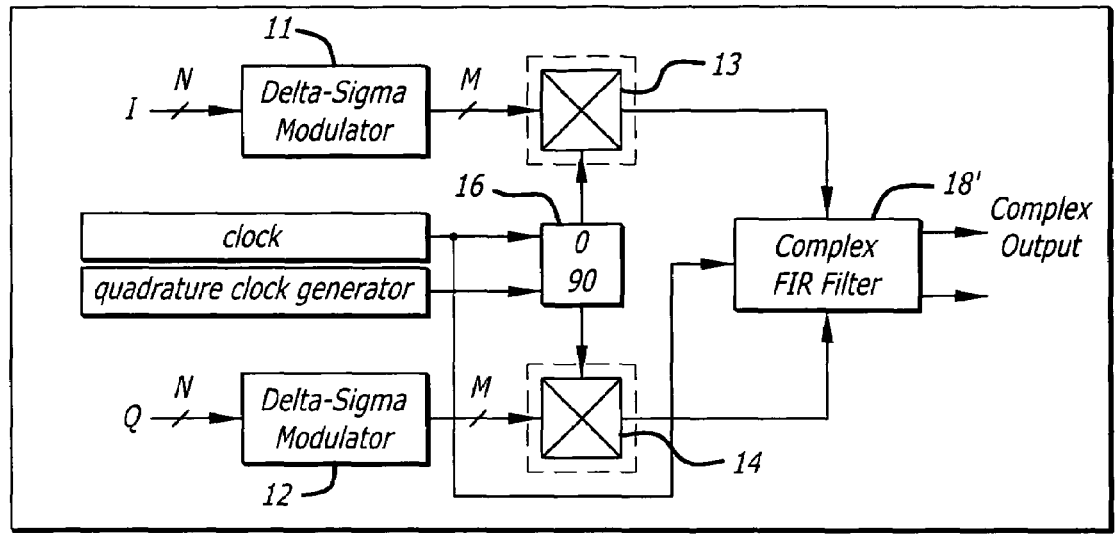
FIG. 2B is a block diagram showing the present invention implemented using a "complex" filter wherein the I and Q outputs from the commutator are filtered with a complex FIR filter.

The basic operation of a delta-sigma transmitter has been described in U.S. patent application Ser. No. 10/998,212, published as publication number US 2005/TBD and entitled Direction Conversion Delta-Sigma Transmitter, which is incorporated herein by reference in its entirety. That transmitter takes advantage of the fact that commutation has the effect of upconverting a baseband signal to a higher frequency as shown in FIG. 1, with two separate sidebands. The commutation also introduces unwanted quantization or commutation noise that should be filtered out before transmission. For purposes of describing the present invention, the basic structure of a delta-sigma transmitter is shown in FIG. 2A or 2B. Quadrature inputs I and Q are N-bit representations of the real and imaginary parts of the baseband waveform. Those two N-bit signals are input to delta-sigma modulators 11 and 12. Delta-sigma modulators 11 and 12 each produce signals which are pulse width modulated (PWM) signals whose pulse widths represent the values of the N-bit input signals. Both the N-bit inputs and the PWM outputs from the delta-sigma modulators carry the information to be transmitted, though in different forms, and therefore constitute information signals. The PWM information signals are the inputs to commutators 13 and 14. Each commutator is a switch that implements the switching or gating function $(-1)^n$, i.e., multiplying the signal by +1 and −1. Alternatively, the commutators could implement a simple On or Off gating of the modulator output, because the Hi and Lo voltage values of the PMW signal are not important. Either way, the commutator produces a gated version of the PWM information signal. In a broad sense, the transmitter circuit includes an information circuit for producing an information signal, and a commutator circuit for commutating the information signal thereby producing an upconverted version of the information signal at a transmission frequency, such as a radio frequency carrier frequency, plus the unwanted quantization noise introduced by the conversion.

The two commutators 13 and 14 are respectively clocked by clock signals that are at the same commutator clock frequency-but 90 degrees out of phase, and produced by quadrature clock generator block 16. That is, the two clock signals are in quadrature. The commutated information signals produced by the commutator are input to either a combining FIR filter 18 that combines the I and Q components to produce a single output as shown in FIG. 2A, or to a complex FIR filter 18' that performs complex filtering and produces quadrature outputs as shown in FIG. 2B. Either way, the output digital filter produces a filtered modulated signal.

As shown in the figures, the same clock frequency is used to clock both the commutators and the digital filter. As used herein, the clocks for both the commutators and for the digital filter may be referred to as the "same" clock, or that the clocks operate at the "same" or "substantially the same" frequency. That terminology will be understood to encompass any method of generating two clocks signals, whether produced from a common clock source and individually buffered and therefore physically separated or not, or even two different clocks that operate at respective frequencies that are slightly different but yet close enough together such that the advantage is realized of a self-tuning output filter whose frequency response automatically changes to tracks changes in the carrier frequency as the commutator clock frequency is varied. Under such conditions the passband of the digital filter will continue to stay centered around approximately the carrier frequency, i.e., approximately one half the commutator clock frequency, thus enabling the digital filter to sufficiently attenuate the quantization noise introduced by the commutator in order to achieve acceptable performance as demanded by a particular application. What is important is that the commutator is clocked so that the modulated information signal has a given carrier frequency, and the digital filter is clocked so that it filters out noise that is substantially out of the range of the carrier frequency plus or minus the baseband information frequency and any sidelobes associated therewith depending on the modulation method used. For example, if the modulation scheme used is amplitude modulation, the bandwidth of interest is plus or minus the baseband information frequency; if frequency modulation is used, the bandwidth of interest will be wider. In the preferred embodiment, for simplicity the commutator clock and the digital filter are derived from the same ultimate clock source, with a 90 degree phase shift introduced for the quadrature clock, with both the commutator and the digital filter being clocked at twice the carrier frequency.

Methods of generating a variable clock signal, i.e., a clock signal whose frequency is variable, so that the carrier frequency of the transmitter can be changed to effect a new carrier frequency of the filtered modulated signal, are well known in the art.

The basic design of the output digital filter is simplified by the fact that output samples of the delta-sigma transmitter are presented either in single-bit format (i.e., one bit each for I and Q) or thermometric code (i.e., where an N-bit output is conveyed using $2^N-1$ thermometric bits such that a number M is represented with digits 1 through M equal to logic "1" and all higher digits equal to logic "0"). Under these circumstances, if flip-flops with both Q and $\overline{Q}$ outputs available are used, both positive and negative FIR coefficients can be implemented using either voltage or current as the operating state-variable.

Figure 3A:
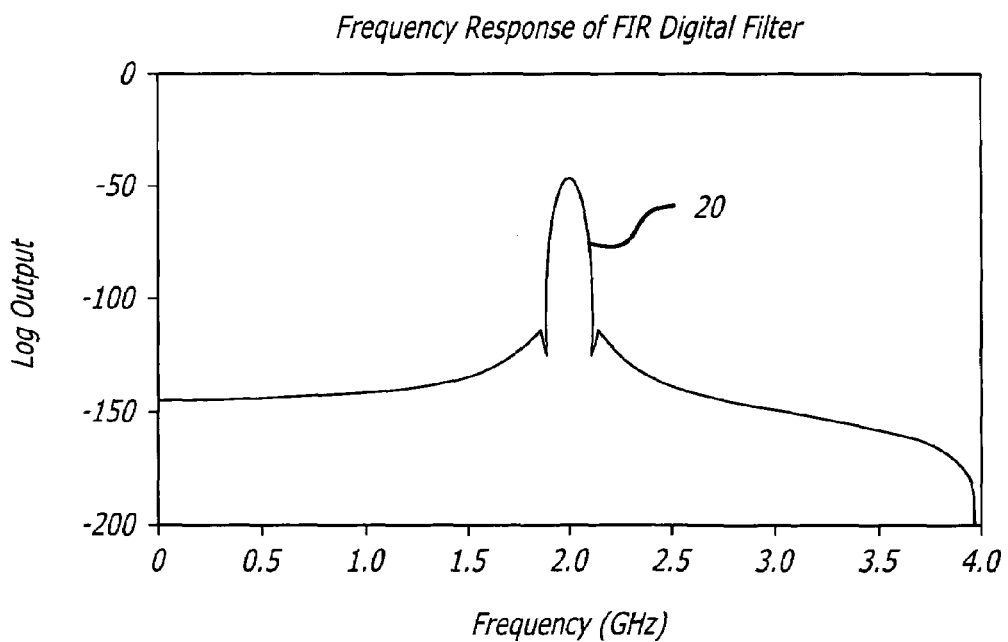
FIG. 3A is a frequency response plot of a high pass FIR digital filter showing the bandpass region that is centered around half the filter clock frequency.
Figure 3B:
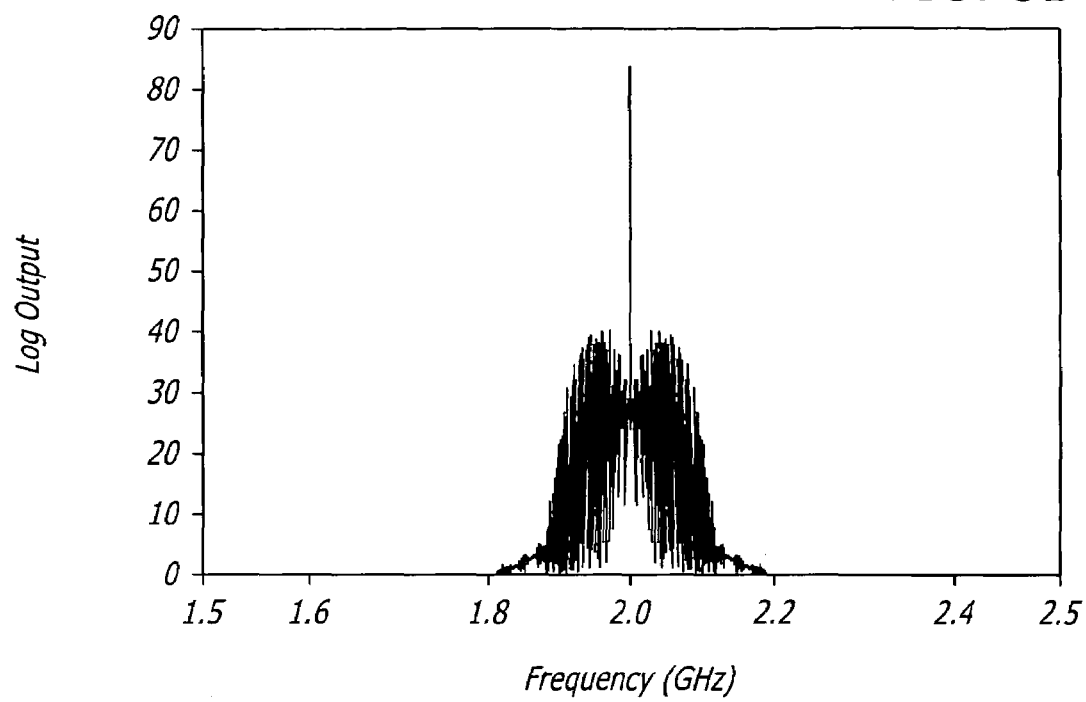
FIG. 3B shows the operation of the filter of FIG. 3A upon the double sideband suppressed carrier output shown in FIG. 1.
Figure 4:
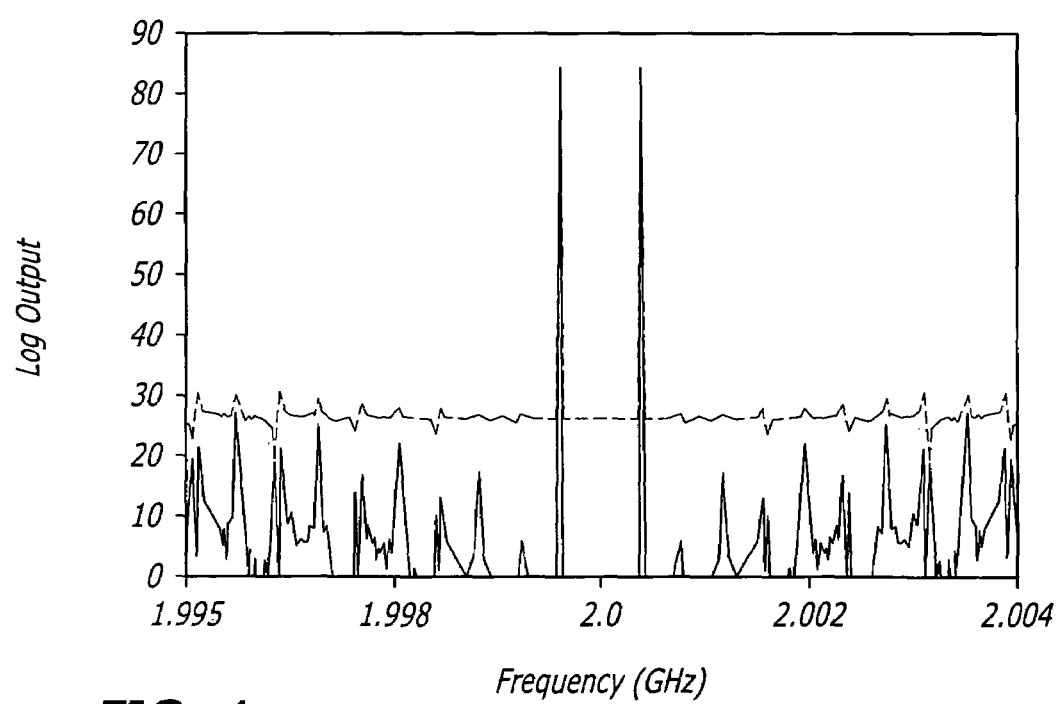
FIG. 4 is an expanded view of FIG. 3B.

FIGS. 3 and 4 summarize the operation of the present invention according to simulations performed. In the preferred embodiment the digital output filter operates at a filter clock rate that is twice the desired carrier frequency. In the illustrative embodiment, the carrier frequency is 2 GHz so the clock frequency is 4 GHz. FIG. 3A illustrates the passband characteristic of a FIR high pass filter designed with a clock rate of 4 GHz. Since the filter is a discrete time filter, the passband characteristic is mirrored around half the sample rate, or 2 GHz. Alternatively, the digital filter could be a passband digital filter that is clocked at a different integer multiple of the carrier frequency.

FIG. 3B illustrates operation of the filter upon the double sideband suppressed carrier output shown in FIG. 1. That is, FIG. 3B shows the spectrum of FIG. 1 after having been filtered by the filter of FIG. 3A. As can be seen, the filtered spectrum falls off rapidly and becomes nearly zero outside the band of approximately 2.0 GHz±0.1 GHz. Outside of that band the quantization noise is suppressed leaving essentially only the desired double sideband signal, i.e., the baseband signal modulated up to the carrier frequency.

FIG. 4 is an expanded view of the center region of FIG. 3B showing in greater detail the output spectrum in the region of the carrier frequency.

Figure 5:
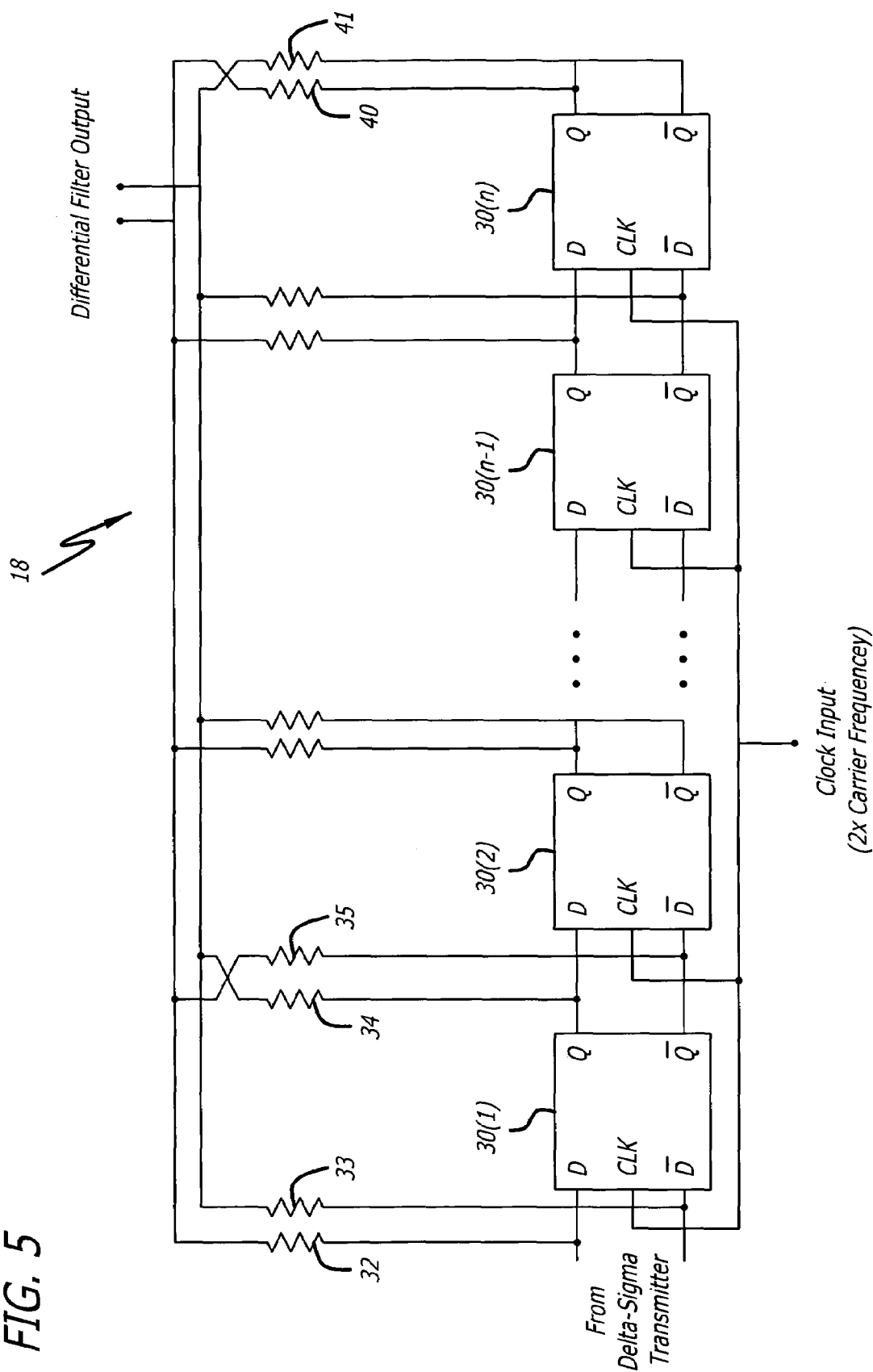
FIG. 5 shows an embodiment in which the FIR tap coefficients are realized by resistive summing of the Q and $\bar{Q}$ outputs from the flip-flips which make up the delay elements.

FIG. 5 illustrates a representative implementation 18 of the digital filter of the present invention that uses voltage as the state variable, and illustrating a single (I or Q) output from the commutator. The raw commutated delta-sigma modulator output, which is essentially a pulse code modulated (PCM) sequence clocking at twice the carrier frequency, is fed into a serial shift register constructed from a chain of D flip-flops 30(1) . . . 30(n). The flip-flops form the delay elements within the FIR filter. The coefficients are realized by resistive summing. Positive impulse response coefficients are implemented by connecting the "Q Resistors" 32, 34, . . . 40 of the corresponding stage to the positive output pin and the "$\overline{Q}$ Resistors" 33, 35, . . . 41 to the negative output pin. The resistors form part of a resistive summing network, with the different resistor values constituting different tap weights and feeding into the summing node, such that differently weighted versions of the respective digital storage element outputs or inputs are summed together to implement the filter. Negative coefficients are implemented by swapping Q and $\overline{Q}$. In the figure, the filter has positive coefficients for the $0^{th}$, $2^{nd}$, and (n−1) stages, and negative coefficients for the $1^{st}$ and $n^{th}$ stages. Resistive summing networks are well known in the art. The transfer function of the output filter is given by the equation in z-transform notation:

$$H(z) = h_0 + h_1 z^{-1} + h_2 z^{-2} + \ldots + h_n z^{-n}$$

where the $j^{th}$ coefficient $h_j$ is given by the formula:

$$h_j = \frac{G_j}{G_0 + G_1 + G_2 + \ldots + G_n}, \text{ and } G_j \equiv R_j^{-1}$$

where $h_0 \ldots h_n$ are the FIR filter tap coefficient values, and where $R_j$ is the value of the $j^{th}$ resistor.

One possible procedure for determining the tap coefficient values is as follows. Begin with the quantization noise spectrum that is created by generating the waveform, as shown in FIG. 1. We want to suppress the noise in order to keep it down to an acceptable level, as defined by the particular application. Synthesize a low pass filter (LPF) using standard techniques for synthesizing FIR filters that would result in the desired noise suppression, then substitute −z for z. Standard techniques for synthesizing LPF tap coefficients are well known in the literature, and include windowing or the Remez exchange algorithm. FIR and FIR digital filter design techniques are taught in, for example, Alan Oppenheim and Ronald W. Schafer, Digital Signal Processing (Prentice-Hall 1975) at pp. 195–271, which is hereby incorporated by reference for its teachings of digital filter theory and design. Once the filter coefficient values are determined, choose a value for the largest coefficient (the largest conductance or the smallest resistance) and choose the remaining values of resistance so that the ratios between the corresponding conductances and largest conductance are preserved.

The diagram in FIG. 5 shows the output configured as a differential output. Alternatively, the positive and negative outputs may be used as a single-ended output carrying the positive and negative sense of the filtered output, respectively.

Figure 6:
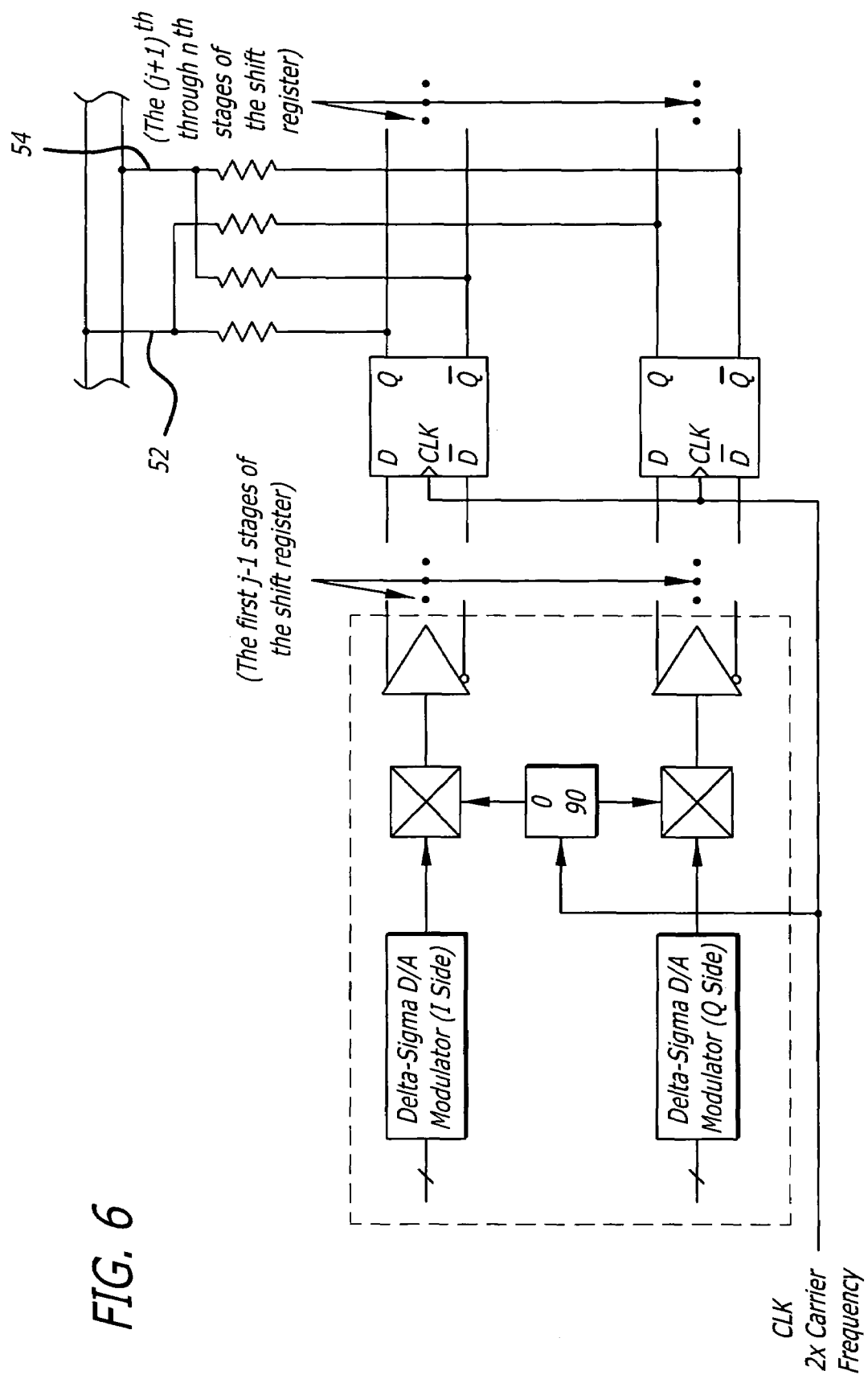
FIG. 6 illustrates how the circuit of FIG. 5 is used within the delta-sigma transmitter.

FIG. 6 illustrates the method for converting the structure shown in FIG. 5 into a real finite impulse response filter operating on the sum of I and Q, using voltage as the state variable. The addition is performed by the resistor network and therefore care must be taken to ensure that resistor values are matched between the I and Q outputs. Note, as well, that the filter may also be configured to operate on the difference between I and Q simply by reversing the sense of each of the differential outputs of the "Q" resistors. When this transformation is used in conjunction with the application of the Hilbert transform to the "I" modulation input to form the "Q" modulation input, the upper and lower sidebands may be generated individually (by selecting the sum or difference of the I and Q outputs). The filter structure of FIG. 6 is similar to that of the filter structure of FIG. 5, although in FIG. 6 only the $j^{th}$ filter stage is shown for convenience. All four resistors shown are of the same value. In order to change the sign of the filter coefficient, the connections 52 and 54 to the rest of the summing network would be swapped.

The FIR filter can also be configured as a complex filter operating on the complex set of I and Q samples. There are many ways this may be realized including the use of the Hilbert transform as well as polyphase filters. In this case, the filter would take on a form similar to that shown in FIG. 6 except that the I and Q resistor values would no longer be identical or connected to the same corresponding stage in the shift register. Instead, the values would be scaled according to the cross-coupling coefficients for each of the stages in accordance with the equation given above for the filter transfer function.

Figure 7:
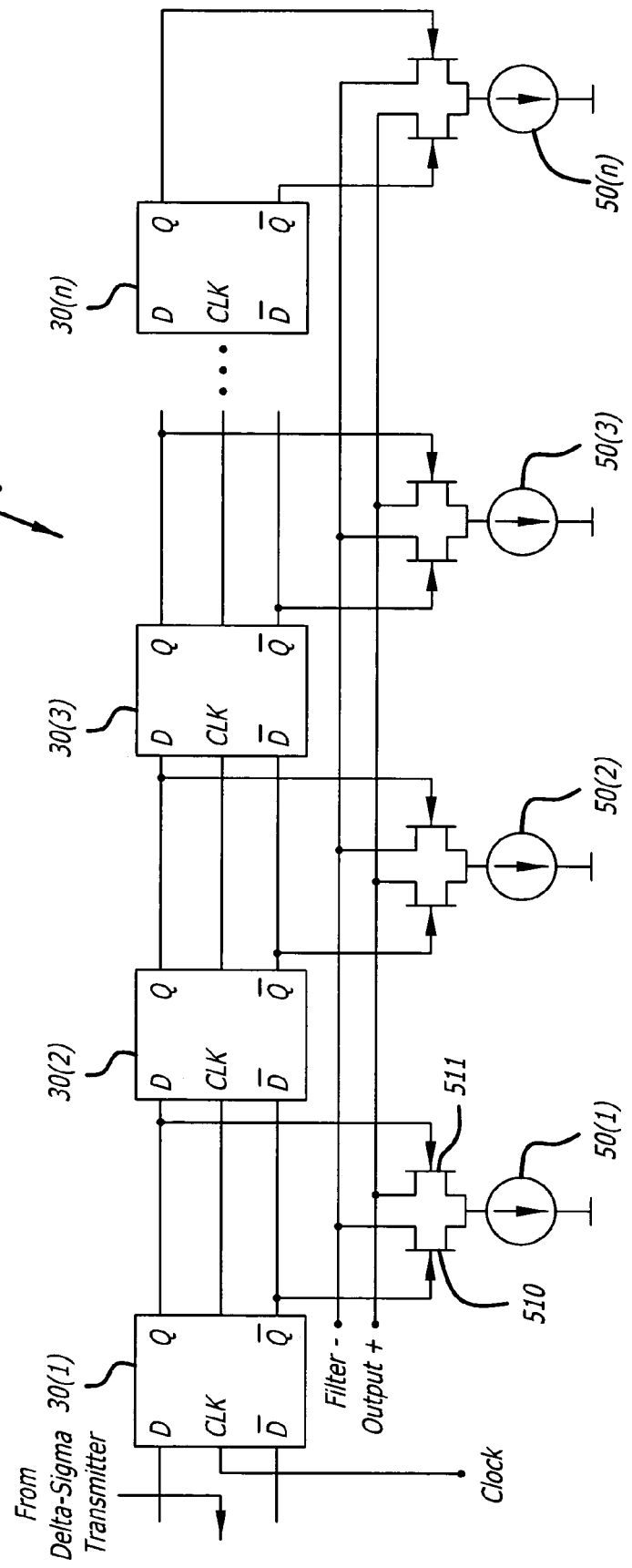
FIG. 7 shows an embodiment in which the FIR tap coefficients are realized by current sources.

FIG. 7 illustrates an implementation 18" of the filter of the present invention in which current is used as the state variable. The current variable approach is mathematically similar to the voltage variable approach, except that the coefficients computed in the transfer function equation are represented by currents instead of voltages. In this approach, the coefficients are implemented by using the current values for each of the differential pairs. The output in this case is a pair of "open drain" transistors 510, 511 to which pull-up resistors or an LC coupling network may be used to drive subsequent stages of amplification. The drain terminals are swapped to implement positive and negative coefficients. In the figure, current sources 50(1) and 50(3) represent positive coefficients, and current sources 50(2) and 50(n) represent negative coefficients, because latched values in stages 1 and stage 3 couple the respective drain sources to the filter output positive terminal, and inverted latched values in stages 2 and n couple the respective drain sources to the filter output negative terminal. Although field effect transistors (FETs) are shown in the figure, this embodiment may also be implemented using bipolar transistors.

The current variable approach has two advantages over the voltage variable approach that make it a generally preferred choice for implementation in high-speed circuits: (1) the coefficients can be reprogrammed simply by changing the currents which is easier to do than switching in resistors to change coefficient values, and (2) the current approach can be arranged to have voltage gain so that the output may be driven directly into a load when appropriate.

The circuit in FIG. 7 may also be applied to the sum of, or difference between, I and Q as well as configured as a complex filter in fashions analogous to the voltage variable case.

There are multiple possible ways to generate the tail currents that represent the coefficients ($I_0$ to $I_n$). FIG. 8 shows one simple way which may be used for fixed coefficient applications, i.e., those in which the coefficients do not have to be reprogrammed. This implementation uses a globally defined reference voltage in conjunction with a current setting resistor to implement each individual coefficient.

The circuit in FIG. 8 may also be further developed to permit the reprogramming of the coefficients digitally. FIG. 9 illustrates one software programmable implementation 50(1)' that uses adjustable current sources to permit setting the coefficients with N-bit resolution. Switch 91 is closed for "On" and switch 92 is closed for "Off." The switches for the other bits operate in the same fashion. A circuit may be implemented with N-bit accuracy using either N binary weighted currents, or $2^N-1$ identical current paths with thermometric coding. If necessary, the polarity of each coefficient may be inverted as well, by using additional current steering transistors in similar fashion to current mode logic circuits. Although FETs are employed here, this embodiment may also be implemented using bipolar transistors It will be appreciated that the term "present invention" as used herein should not be construed to mean that only a single invention having a single essential element or group of elements is presented. Similarly, it will also be appreciated that the term "present invention" encompasses a number of separate innovations which can each be considered separate inventions. Although the present invention has thus been described in detail with regard to the preferred embodiments and drawings thereof, it should be apparent to those skilled in the art that various adaptations and modifications of the present invention may be accomplished without departing from the spirit and the scope of the invention. As one example, although it is preferred that the output digital filter be an FIR filter, the filter could be an infinite impulse response filter. Additional ways could also used to realize analog coefficients as will be apparent to those skilled in the art. Furthermore, although it is preferred, it is not strictly necessary that the digital filter produce an analog output directly; rather then digital filter could be a filter having both a digital input and a digital output, with analog-to-digital conversion being performed on the digital output from the filter. Accordingly, it is to be understood that the detailed description and the accompanying drawings as set forth hereinabove are not intended to limit the breadth of the present invention, which should be inferred only from the following claims and their appropriately construed legal equivalents.

The invention claimed is:

1. A transmitter circuit comprising:
   a delta-sigma modulator for producing a first information signal;
   a commutator for commutating the first information signal to produce a commutated information signal, the commutator being clocked by a commutator clock operating at a commutator clock frequency;
   a digital filter for receiving the commutated information signal and producing a filtered modulated signal, the digital filter clocked by a filter clock, the digital filter having a passband centered around approximately one half the commutator clock frequency.

2. The circuit of claim 1 further comprising:
   a variable frequency clock generator for producing a variable clock, the variable clock being operatively connected to both the digital filter clock and the commutator clock, whereby as the variable clock frequency is changed to effect a new carrier frequency of the filtered modulated signal, the passband of the digital filter is automatically retuned to the new carrier frequency.

3. The circuit of claim 1 wherein the filter clock operates at substantially the same frequency as the commutator clock.

4. The circuit of claim 3 wherein the filter clock shares a common source with the commutator clock.

5. The circuit of claim 1 wherein the digital filter is a high pass finite impulse response filter, and the passband of the digital filter is a result of aliasing within said high pass filter.

6. The circuit of claim 1 wherein the filtered modulated signal is transmitted at a carrier frequency, and both the digital filter and the commutator are clocked at a frequency of approximately twice the carrier frequency.

7. The circuit of claim 6 wherein the carrier frequency is a radio frequency.

8. The circuit of claim 1 wherein the commutated information signal is a single-bit signal and the digital filter is a single-bit digital filter.

9. The circuit of claim 1 wherein the commutated information signal is a multiple-bit thermometric signal, and said digital filter is a multiple-bit thermometric filter.

10. A method of generating a modulated signal for transmission, the method comprising:
  receiving a pulse width modulated (PWM) signal;
  gating the PWM signal at approximately twice the frequency of a predetermined carrier frequency to produce a gated version of the PWM signal;
  filtering the gated version using a digital filter clocked at an integer multiple of the carrier frequency to produce a filtered modulated signal; and
  transmitting the filtered modulated signal at a frequency centered about said carrier frequency.

11. The method of claim 10 wherein said integer is two.

12. The method of claim 10 further comprising producing said PWM signal by delta-sigma modulation.

13. The method of claim 10 wherein said filtering step comprises:
  clocking said gated version into a serial shift register comprising a plurality of delay elements, each delay element having a respective output; and
  summing differently weighted versions of said delay element outputs to produce said filtered modulated signal.

14. The method of claim 13 further comprising:
  changing respective weights associated with said differently weighted versions in order to change a frequency response of the digital filter.

15. A transmitter circuit comprising:
  an information circuit for producing an information signal, the information signal having a predetermined bandwidth;
  a commutator circuit for commutating the information signal therebyproducing an upconverted version of the information signal at a radio frequency carrier frequency plus some conversion noise: and
  a filter comprising:
    a plurality of digital storage elements, each of said storage elements having respective inputs and outputs, at least some of said digital storage element having their inputs operatively connected with an output from another one of said digital storage elements;
    a plurality of tap elements, each of said tap elements operatively connected to a respective one of said digital storage element inputs or outputs, each of said tap elements producing a respective analog output; and
    a summer for summing said analog outputs;
  wherein the filter circuit is operatively connected to the commutator circuit to receive the upconverted version of the information signal and substantially reduce frequencies outside of the range of the carrier frequency plus or minus the predetermined bandwidth thereby substantially reducing said conversion noise.

16. The circuit of claim 15 wherein said tap elements have respective numerical values defining tap values associated respectively therewith, the tap values being selected so that the circuit defines a digital filter circuit having an analog output.

17. The circuit of claim 16 wherein said digital filter circuit defines a single-bit digital filter having an analog output.

18. The circuit of claim 15 wherein said tap elements comprise resistors, and said summer comprises a resistive summer.

19. The circuit of claim 15 wherein said tap elements comprise adjustable current sources.

* * * * *